United States Patent

Bernardini

[11] Patent Number: 5,823,793
[45] Date of Patent: Oct. 20, 1998

[54] HOLDER FOR AN ELECTRICAL OR ELECTRONIC COMPONENT

[75] Inventor: Allen J. Bernardini, Southbury, Conn.

[73] Assignee: Litton Systems, Inc., Watertown, Conn.

[21] Appl. No.: 662,211

[22] Filed: Jun. 12, 1996

[51] Int. Cl.⁶ .................................................. H01R 9/09
[52] U.S. Cl. ............................................................ 439/68
[58] Field of Search ............................... 439/931, 68, 71, 439/751, 84, 86

[56] References Cited

U.S. PATENT DOCUMENTS

| | | |
|---|---|---|
| 3,813,637 | 5/1974 | Grebik et al. |
| 4,089,041 | 5/1978 | Lockard ................................. 439/68 X |
| 4,191,440 | 3/1980 | Schramm . |
| 4,727,456 | 2/1988 | Mehta et al. ........................ 439/931 X |
| 4,747,784 | 5/1988 | Cedrone . |
| 4,838,799 | 6/1989 | Tonooka ............................... 439/931 X |
| 5,073,119 | 12/1991 | Soes ...................................... 439/751 X |
| 5,147,228 | 9/1992 | Miller et al. . |
| 5,211,579 | 5/1993 | Seong et al. . |
| 5,224,880 | 7/1993 | Schempp ............................. 439/751 X |

*Primary Examiner*—P. Austin Bradley
*Assistant Examiner*—Daniel Wittels
*Attorney, Agent, or Firm*—Michael H. Wallach

[57] ABSTRACT

A holder for an electrical or electronic component includes a body formed of electrically non-conductive material. The body is generally U-shaped having a pair of laterally spaced arms bridged by a bight. Conductive tracing on the arms establishes an electrical connection between the component and a printed circuit board when the holder is electrically connected to the printed circuit board and the terminals of a component contact the arms.

31 Claims, 4 Drawing Sheets

HOLDER FOR AN ELECTRICAL OR ELECTRONIC COMPONENT

FIELD OF THE INVENTION

The present invention relates to holders for electrical or electronic components and in particular to a holder for an electrical or electronic component to establish a mechanical and electrical connection between the component and a printed circuit board or the like.

BACKGROUND OF THE INVENTION

Printed circuit boards or the like on which electrical and/or electronic components are mounted are well known in the art. In the past, printed circuit boards have typically included plated through-holes therein through which the metallic pins of the components are inserted. Once inserted, the metallic pins are soldered to the printed circuit board to establish mechanical and electrical connections between the components and the printed circuit boards. Unfortunately, this design poses problems in that if a component fails, it is necessary to desolder the component, clean the surface of the printed circuit board and then resolder a replacement component to the printed circuit board. As will be appreciated, this is a difficult and time consuming process even for the very skilled. Also, the need for plated through-holes through the printed circuit board decreases the number of components which can accommodated on the printed circuit board.

In order to eliminate the need for plated through-holes through which the metallic pins of a component are inserted and thereby increase the number of components which can be accommodated on the printed circuit board, surface mount component holders for printed circuit boards have been developed. Surface mount components typically include conductive pads on their undersurface which are soldered directly onto the surface of the printed circuit board. To facilitate removal of a failed surface mount component, surface mount component holders have been developed. Theses surface mount component holders include a plastic body accommodating metallic clips which are soldered onto the printed circuit board. A component is releasably retained in the body between contact points on the clips. Thus, if the component fails, it can be removed from the surface mount component holder and replaced. Although this design allows components to be replaced, the surface mount component holders are relatively expensive to manufacture. Accordingly, improved designs to facilitate replacement of fuses and/or other electrical and electronic surface mount components are continually being sought.

It is therefore an object of the present invention to provide a novel holder for an electrical or electronic component.

SUMMARY OF THE INVENTION

According to one aspect of the present invention there is provided a holder for an electrical or electronic component comprising:

a body formed of electrically non-conductive material and including a pair of laterally spaced arms to contact opposed terminals of a component; and conductive tracing on said arms to establish electrical connections between said opposed terminals and a printed circuit board or the like when said holder is electrically connected to said printed circuit board and retains a component.

In one form, the body is formed of plastic material and is generally U-shaped having a bight bridging the arms. The bight is not covered with conductive tracing and therefore electrically isolates the arms. The lateral spacing between the arms can be selected to require the component to be press-fitted between the arms.

In one embodiment, the arms extend beyond the bight to define pads to contact the printed circuit board. The pads are soldered to the printed circuit board to effect a mechanical and low resistance electrical connection between the holder and the printed circuit board.

In another embodiment, the holder includes projections covered with conductive tracing extending from the arms and designed to be inserted into plated through-holes formed in the printed circuit board. In one form, the projections are configured to conform with the inside diameter of plated through-holes in a printed circuit board into which the projections are inserted to establish a solderless mechanical and low resistance electrical connection. In another form, the projections are designed to be inserted into the plated through-holes and then soldered to the printed circuit board to establish the desired mechanical and electrical connection.

According to another aspect of the present invention there is provided a holder for an electrical or electronic component comprising:

a body formed of electrically non-conductive material and including a pair of laterally spaced arms to contact opposed terminals of a component and a spacing element bridging said arms, said arms extending beyond said spacing element to define pads to contact a printed circuit board or the like; and conductive tracing covering said arms including said pads to establish electrical connections between said opposed terminals and a printed circuit board when said pads are electrically connected to said printed circuit board and said holder retains a component.

According to still yet another aspect of the present invention there is provided a holder for an electrical or electronic component comprising:

a body formed of electrically non-conductive material and including a pair of laterally spaced arms to contact opposed terminals of a component;

projections extending from said body to be inserted into plated through-holes in a printed circuit board or the like; and conductive tracing covering said arms and said projections to establish electrical connections between said opposed terminals and said printed circuit board when said projections are inserted into said plated through-holes and said holder retains a component.

The present invention provides advantages in that the holder is easily and inexpensively manufactured while allowing components to be quickly and easily removed and replaced.

BRIEF DESCRIPTION OF THE DRAWINGS

Embodiments of the present invention will now be described more fully with reference to the accompanying drawings in which.

DESCRIPTION OF THE PREFERRED EMBODIMENTS

Figure 1:
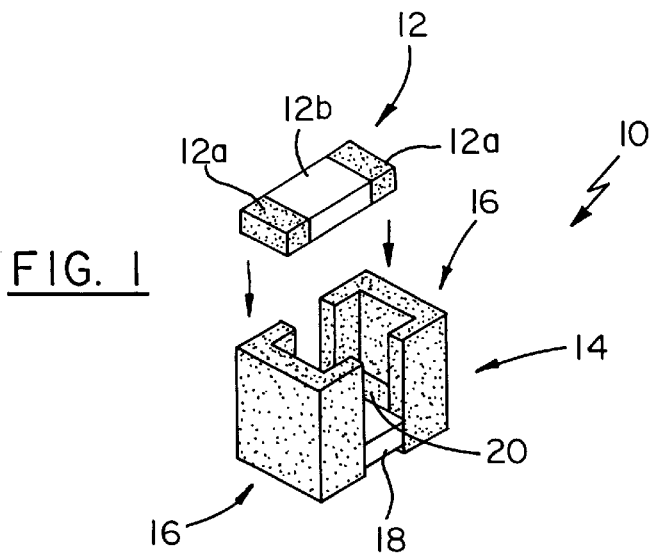
FIG. 1 is a perspective view of a holder for an electrical or electronic component in accordance with the present invention in combination with a surface mount fuse.
Figure 2:
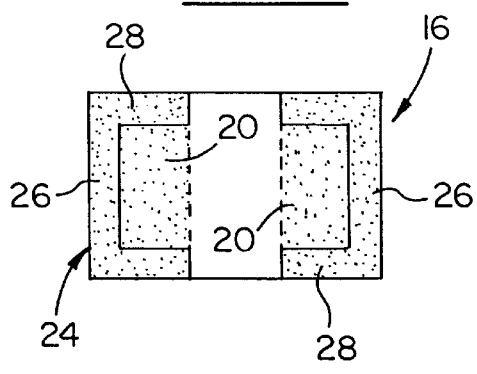
FIG. 2 is a top plan view of the holder of FIG. 1.
Figure 3:
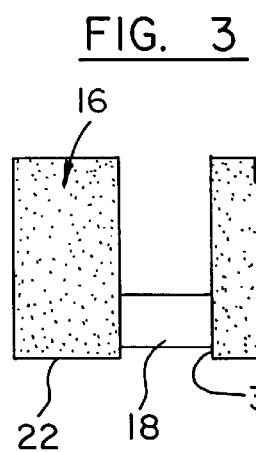
FIG. 3 is a front elevational view of the holder of FIG. 1.
Figure 4:
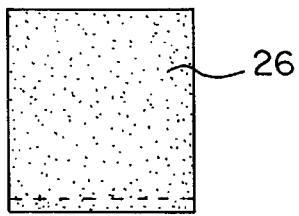
FIG. 4 is a side elevational view of the holder of FIG. 1.
Figure 5:
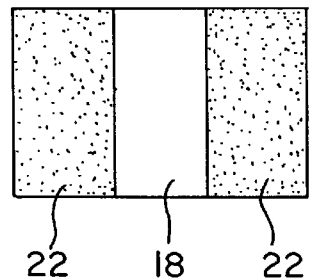
FIG. 5 is a bottom plan view of the holder of FIG. 1.
Figure 6:
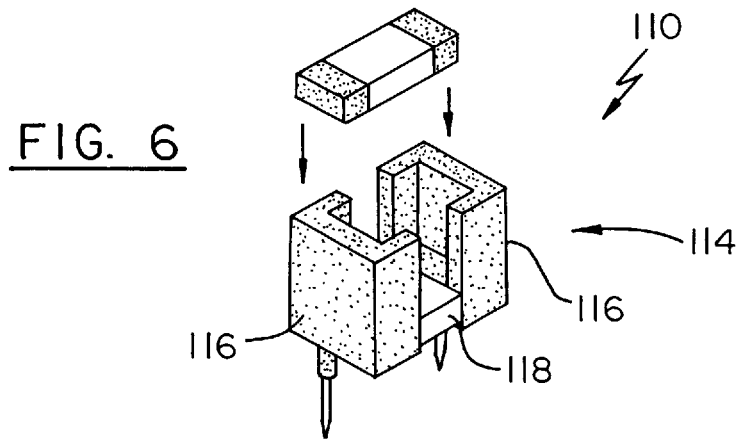
FIG. 6 is a perspective view of another embodiment of a holder for an electrical or electronic component in accordance with the present invention.
Figure 7:
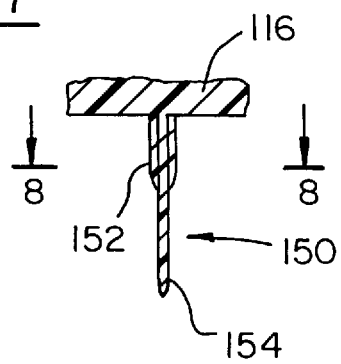
FIG. 7 is a partial cross-sectional view of the holder of FIG. 6.

Referring now to FIGS. 1 to 5, a holder for a surface mount electrical or electronic component is shown and is generally indicated to by reference numeral 10. In the particular embodiment illustrated in these Figures, the holder 10 is designed to retain releasably a surface mount component in the form of a fuse 12.

Holder 10 includes a unitary body 14 formed of electrically nonconductive material such as for example, plastic. Body 14 is generally U-shaped and includes a pair of upstanding arms 16 bridged by a bight 18. Each arm 16 includes a rectangular base 20 having a bottom surface 22 defining a pad as well as an upper C-channel 24 having an end wall 26 and inwardly directed flanges 28 along the side edges thereof Bight 18 is spaced slightly from the bottom surfaces 22 to define a transverse notch 30.

Low resistance electrically conductive tracing indicated by the striping in the Figures covers both of the arms 16 while the bight 18 is free from such conductive tracing to isolate electrically the two arms. The conductive tracing is applied on the arms 16 using electroplating or other suitable plating technique. In the case of fuse holders, the conductive tracing will typically include a copper underplate on the arms 16 covered with tin, lead or gold. In the case of other electrical or electronic components, the conductive tracing may include a copper underplate on the arms 16, a layer of nickel over the copper underplate for wear purposes and a precious metal on the nickel such as for example gold, silver or palladium.

The pads are designed to be attached to a printed circuit board via reflow soldering to establish a mechanical and low resistance electrical connection between the holder 10 and a circuit on the printed circuit board.

The lateral spacing between the arms 16 is selected to require an electrical or electronic component to be press-fitted between the arms with opposed terminals of the component contacting the conductive tracing on the arms. As shown in FIG. 1, the fuse 12 has a pair of laterally spaced conductive terminals 12a bridged by a conductive fusible element 12b. When pads of the holder 10 are soldered to the printed circuit board and the fuse 12 is press-fitted between the arms 16 with its terminals 12a in contact with the conductive tracing on the arms, the fuse 12 becomes electrically connected to the circuit on the printed circuit board by way of the holder 10. Should the fuse open circuit as a result of an overload or other fault condition, the fuse 12 can be easily removed from the holder 10 and replaced with a new fuse.

Referring now to FIGS. 6 to 9, another embodiment of a holder for electrical or electronic components is shown. In this embodiment, like reference numerals will be used to indicate like components of the first embodiment with a "100" added for clarity. As can be seen, holder 110 has a body 114 formed of a unitary piece of electrically non-conductive material. Similar to the previous embodiment, body 114 is generally U-shaped and includes a pair of laterally spaced arms 116 bridged by a bight 118. Low resistance electrical conductive tracing indicated by the striping covers the arms 116 while the bight 118 is free from conductive tracing to isolate electrically the arms.

Figure 8:
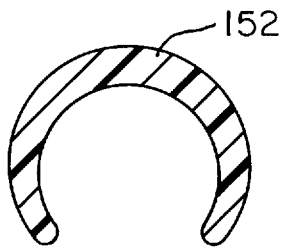
FIG. 8 is an enlarged cross-sectional view of FIG. 7 taken along line 8—8.
Figure 9:
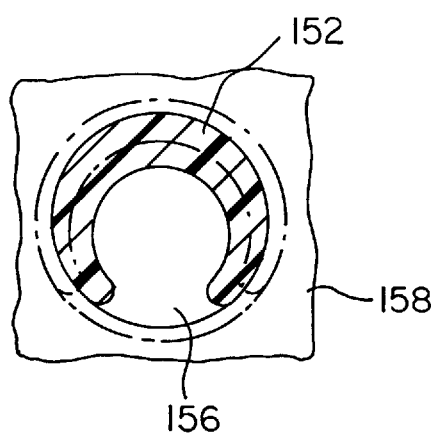
FIG. 9 is an enlarged cross-sectional view of a portion of the holder of FIG. 6 inserted into a hole in a printed circuit board.

Unlike the previous embodiment, projections 150 are integrally formed with and extend from the rectangular base 120 of each arm 116. Conductive tracing covers the projections 150 and forms an electrical connection with the conductive tracing on the arms. The projections 150 are shaped to effect a solderless mechanical and low resistance electrical connection between the holder 110 and a circuit on a printed circuit board when inserted into plated through-holes formed in the printed circuit board. In the illustrated embodiment, the projections 150 are of a configuration similar to the central portion and tails of the solderless electrical contacts shown in U.S. Pat. No. 4,017,143 to Knowles and assigned to Litton Systems, Inc., the content of which is incorporated herein by reference. As is best seen in FIGS. 8 and 9, each projection 150 has an upper section 152 with a C-shaped cross-section formed by oppositely extending arcuate arms which taper to a reduced cross-sectional thickness towards their distal ends. A tail 154 extends downwardly from the upper section 152. The tapering arms provide generally uniformly stressed beam sections which allow the outer diameter of the upper C-shaped section 152 to conform better to the inside diameter of the plated through-hole into which the projections are inserted.

When the projections 150 are inserted into plated through-holes 156 in the printed circuit board 158 (best seen in FIG. 9), the upper sections 152 conform to the inside diameter of the through-holes 156 to achieve the desired mechanical and electrical connection. Although the holder 110 is shown to include two projections 150, additional projections can be provided on each rectangular base 120 for high-current carrying applications to provide additional current paths between the component retained by the holder 110 and the circuit on the printed circuit board. In addition, although a particular embodiment of a projection has been shown, those of skill in the art should appreciate that other projection configurations to form the desired solderless mechanical and low resistance electrical connection between the holder and printed circuit board can be used and are well within the scope of the present invention.

Figure 10:
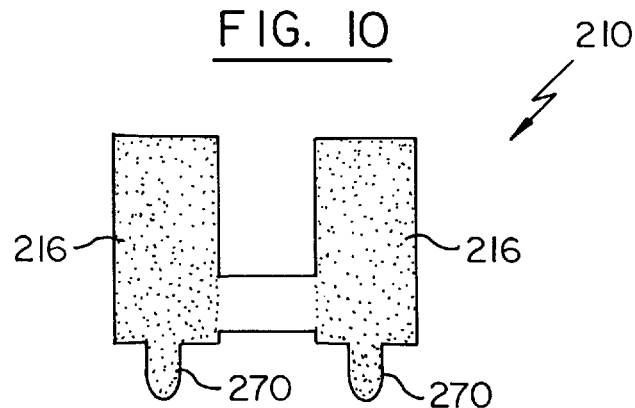
FIG. 10 is a front elevational view of yet another embodiment of a holder for an electrical or electronic component in accordance with the present invention.
Figure 11:
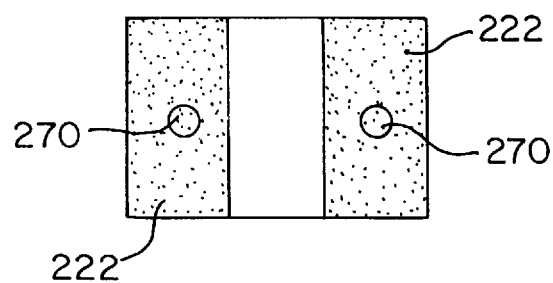
FIG. 11 is a bottom plan view of the holder of FIG. 10.

Alternatively as shown in FIGS. 10 and 11, the pads 222 may be provided with integrally formed generally cylindrical projections 270. Conductive tracing covers the arms 216 including the projections 270. The projections 270 are designed to be inserted into the plated through-holes in the printed circuit board and then soldered to the printed circuit board to effect the desired mechanical and low resistance electrical connection between the holder 210 and the printed circuit board.

Although FIGS. 1 to 11 show the holder 10 configured to retain a fuse, those of skill in the art will appreciate that other electrical or electronic surface mount components may be accommodated by the holder to allow the components to be releasably connected both mechanically and electrically to a circuit on the printed circuit board. The shape of the body 14 may of course have to be altered to accommodate the component depending on the profile and physical dimensions of the component.

Figure 12:
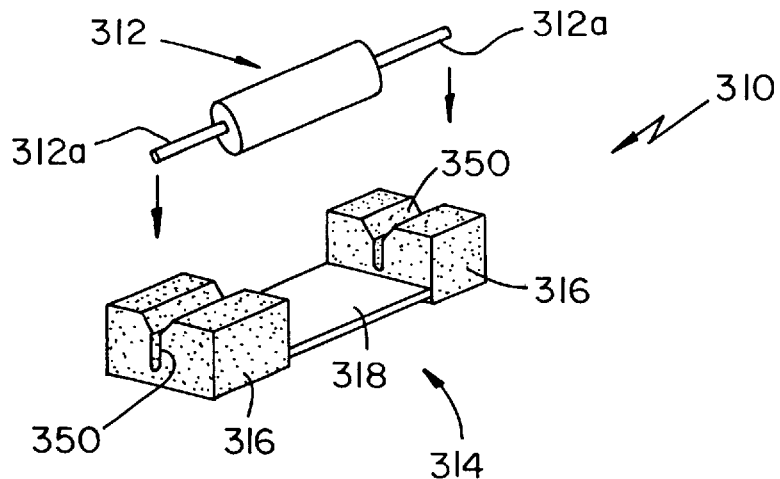
FIG. 12 is a perspective view of yet another embodiment of a holder for an electrical or electronic component in accordance with the present invention.

For example, referring now to FIG. 12, yet another embodiment of a holder for electrical or electronic components is shown. In this embodiment, like reference numerals will be used to indicate like components of the first embodiment with a "300" added for clarity. As can be seen, holder 310 is designed to retain an axial leaded component 312 and includes a unitary body 314 formed of electrically non-conductive material. Similar to the previous embodiments, body 314 includes a pair of laterally spaced arms 316 bridged by a bight 318. Low resistance conductive tracing covers the arms 316 as indicated by the striping. Unlike the previous embodiment, each arm has a slot 350 formed therein. The slots 350 are aligned and are designed to accommodate opposed axial leads 312a of component 312. The width of each slot 350 increases adjacent the upper surface of the arm 316 to facilitate positioning of the component before the leads 312a are press-fitted into the slots 350.

Figure 13:
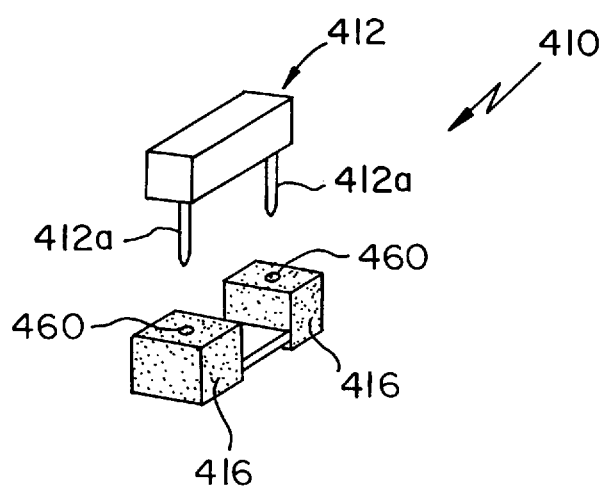
FIG. 13 is a perspective view of still yet another embodiment of a holder for an electrical or electronic component in accordance with the present invention.

FIG. 13 shows yet another embodiment of a holder for electrical or electronic components similar to that of FIG. 12. However unlike, the embodiment of FIG. 12, the arms 416 have holes 460 formed therein to accommodate the end leads 412a of a multipin component 412. The interior surfaces and the exterior surfaces of the arms 416 are coated with conductive tracing to establish electrical connections between the terminals of the component 412 when the holder 410 retains the component and is electrically connected to a printed circuit board. Although each arm 416 is shown to include one hole, it should be appreciated that multiple holes can be provided in the arms to accommodate the corresponding leads of a component.

Although the body of the holder in the above-described embodiments has been described as being of unitary construction and formed from a single piece of electrically non-conductive plastic material, it should be appreciated that the arms and bight may be formed separately and joined together by fusion, adhesive or other suitable means. Also, the holder may be formed of any suitable non-conductive material which can be coated with electrically conductive material.

In addition, although the arms have been described as being basically entirely covered with conductive tracing, the conductive tracing can be applied on the arms 116 in a manner to define discrete conductive paths between opposed terminals of a component retained by the holder and a circuit on the printed circuit board when the holder is electrically connected to the printed circuit board and retains a component. Also, although the conductive tracing has been described as being applied on the holder using electroplating techniques, other techniques such as for example metal deposition, sputtering, spray coating or conductive ink or epoxy coating may be used to apply the conductive tracing.

The present invention provides advantages in that components accommodated by the holder can be removed and replaced quickly and easily without requiring the holder to be removed from the printed circuit board. Also, the design of the holder allows the holder to be manufactured easily and inexpensively while still allowing the desired mechanical and low resistance electrical connection between the holder and the printed circuit board to be made.

It will be appreciated that other modifications and variations may be made to the present invention without departing from the spirit and scope thereof as defined by the appended claims.

I claim:

1. A holder for an electrical or electronic component, said electrical or electronic component having two opposed terminals, comprising:

a body formed of an electrically non-conductive material and including two laterally spaced arms connected by a bight, said two laterally spaced arms and said bight defining a recess for receiving the electrical or electronic component, and a conductive tracing on each of said arms with each conductive tracing capable of providing an electrical path between one of said two opposed terminals and a portion of a printed circuit board.

2. A holder as defined in claim 1 wherein said body is formed of plastic material.

3. A holder as defined in claim 2 wherein said body is generally U-shaped and wherein said bight is free of conductive tracing such that said bight electrically isolates said arms.

4. A holder as defined in claim 3 wherein each of said arms includes a rectangular base and a C-channel extending from said base, said C-channels accommodating the opposed terminals of said component.

5. A holder as defined in claim 4 wherein said conductive tracing substantially covers exterior surfaces of said arms.

6. A holder as defined in claim 3 wherein said arms extend beyond said bight to define pads to contact said pads having conductive tracing thereon.

7. A holder as defined in claim 1 wherein the lateral spacing between said arms is selected to require the component to be press-fitted therebetween and the arms are resiliently biased towards each other to retain the component therebetween.

8. A holder as defined in claim 7 wherein said arms extend beyond said bight to define pads to contact the printed circuit board, said pads having conductive tracing thereon.

9. A holder as defined in claim 8 wherein said body is formed of plastic material.

10. A holder as defined in claim 1 further including projections extending from said body to be inserted into plated through-holes formed in the printed circuit board, said projections being at least partially covered with said conductive tracing.

11. A holder as defined in claim 10 wherein said projections are configured to form a solderless mechanical and low resistance electrical connection with the printed circuit board when inserted into the plated through-holes.

12. A holder as defined in claim 10 wherein said projections are integrally formed with said arms.

13. A holder as defined in claim 1 wherein each of said arms has a slot formed therein to accommodate an axial lead of said component press-fitted therein.

14. A holder as defined in claim 13 wherein a slot is formed in an upper surfaces of each of said arms and wherein said slots increase in width adjacent said upper surfaces.

15. A holder as defined in claim 1 wherein each of said arms has at least one hole formed therein to accommodate an end lead of said component press-fitted therein.

16. The holder as defined in claim 1, wherein said body has a first side and a second side with a gap in said first and second sides laterally spacing said two laterally spaced arms.

17. The holder as defined in claim 1, wherein said body receives a single electrical or electronic component.

18. A holder for an electrical or electronic component, said electrical or electronic component having two apposed terminals, comprising:
  a body formed of an electrically non-conductive material and including two laterally spaced arms connected by a bight, said two laterally spaced arms and said bight defining a recess for receiving the electrical or electronic component, said arms extending beyond said bight to define pads to contact a printed circuit board; and
  conductive tracing covering each of said arms including said pads with each conductive tracing capable of providing an electrical path between one of said two opposed terminals and a portion of the printed circuit board.

19. A holder as defined in claim 18 wherein the lateral spacing between said arms is selected to require the component to be press-fitted therebetween and the arms are resiliently biased towards each other to retain the component therebetween.

20. A holder as defined in claim 19 wherein said conductive tracing substantially covers exterior surfaces of said arms.

21. A holder as defined in claim 20 wherein said body is formed of plastic material.

22. A holder as defined in claim 18 wherein each of said arms has at least one hole formed therein to accommodate an end lead of said component press-fitted therein.

23. A holder as defined in claim 18 wherein each of said arms has a slot formed therein to accommodate an axial lead of said component press-fitted therein.

24. The holder as defined in claim 18, wherein said body has a first side and a second side with a gap in said first and second sides laterally spacing said two laterally spaced arms.

25. The holder as defined in claim 18, wherein said body receives a single electrical or electronic component.

26. A holder for an electrical or electronic component, said electrical or electronic component having two opposed terminals, comprising:
  a body formed of an electrically non-conductive material and including two laterally spaced arms connected by a bight, said two laterally spaced arms and said bight defining a recess for receiving the electrical or electronic component
  projections extending from said body to be inserted into plated through-holes in a printed circuit board; and
  a conductive tracing covering each of said arms and said projections with each conductive tracing capable of providing an electrical path between one of said two opposed terminals and a portion of the printed circuit board.

27. A holder as defined in claim 26 wherein said projections are configured to form a solderless mechanical and low resistance electrical connection with the printed circuit board when inserted into the plated through-holes.

28. A holder as defined in claim 26 wherein said projections are integrally formed with said arms.

29. A holder as defined in claim 26 wherein said body is formed of plastic material and wherein said conductive tracing substantially covers exterior surfaces of said arms.

30. The holder as defined in claim 26, wherein said body has a first side and a second side with a gap in said first and second sides laterally spacing said two laterally spaced arms.

31. The holder as defined in claim 26, wherein said body receives a single electrical or electronic component.

* * * * *